United States Patent [19]
Van Houten et al.

[11] Patent Number: 5,130,765
[45] Date of Patent: Jul. 14, 1992

[54] ELEMENT HAVING A NONLINEAR TRANSMISSION CHARACTERISTIC

[75] Inventors: Hendrik Van Houten; Laurens W. Molenkamp, both of Eindhoven, Netherlands

[73] Assignee: U.S. Philips Corp., New York, N.Y.

[21] Appl. No.: 667,739

[22] Filed: Mar. 11, 1991

[30] Foreign Application Priority Data

Mar. 24, 1990 [NL] Netherlands ............... 9000698

[51] Int. Cl.$^5$ .................................... H01L 29/80
[52] U.S. Cl. .................................... 357/22; 357/41; 357/56
[58] Field of Search ............... 357/22 A, 22 J, 22 I, 357/22 G, 22 MD, 41, 56

[56] References Cited

U.S. PATENT DOCUMENTS 4,677,457  6/1987  Wolter ........................ 357/22 A
4,996,570  2/1991  Van Houten et al. ........ 357/22 A Primary Examiner—Georgia Y. Epps
Attorney, Agent, or Firm—Steven R. Biren

[57] ABSTRACT

An element for use in an electrical circuit includes sub-region (11) and a second sub-region (12), which regions can contain a charge carrier gas (6) at least during operation and are separated from one another by an insulation zone (13). The insulaton zone (13) is locally interrupted by a barrier zone (15) which presents a potential barrier to the charge carriers. The first sub-region (11) is provided with a first connection (21) for deriving the potential from it. The second sub-region (12) is provided with two connections (22, 23) by means of which a current (I) can be passed through the second sub-region (12). The potential of the first sub-region (11) is found to be proportional to at least substantially the square of the current (I) passed through the second sub-region. This renders the element particularly suitable for an electrical circuit in which such a proportionality is desired.

6 Claims, 4 Drawing Sheets

ELEMENT HAVING A NONLINEAR TRANSMISSION CHARACTERISTIC

BACKGROUND OF THE INVENTION

The invention relates to an element for use in an electrical circuit, comprising a body having a region in which a charge carrier gas can be formed, which region comprises a first and a second sub-region which are separated from one another by an insulation zone at least during operation, the first sub-region being provided with a first electrical connection and the second sub-region comprising a second and a third electrical connection.

Such an element is known from a Netherlands Patent Application laid open to public inspection under no. 8703119 and corresponding U.S. Pat. No. 4,996,570. The element described therein comprises a layer or layer structure in which a degenerated charge carrier gas is present during operation. The charge carrier gas is distributed over the two sub-region, which are interconnected by a channel. Apart from the first connection, the first sub-region further comprises a fourth connection. During operation, a current is sent through the channel by means of two connections, while a voltage can be derived between the other connections on either side of the channel.

SUMMARY OF THE INVENTION

The known element has a fixed resistance which is independent of ambient parameters at a given width of the channel. The known element, as a result, is highly effective if a constant resistance is desired. The derived voltage is then linearly dependent on the current conducted through the channel.

For some applications, such as, for example, signal mixing and parametric amplification of alternation signals, it is desirable on the other hand to have available an element whose transmission characteristic is non-linear and more particularly quadratic, which is not possible with the known device. The present invention has for its object inter alia to provide an element whose output signal is at least substantially proportional to the square of the input signal.

According to the invention, an element of the kind described above is characterized in that the insulation zone between the two sub-regions is locally interrupted by a barrier zone which forms a potential barrier for the charge carriers whose level is lower than that of the adjoining insulation zone, in that the second and third connections are provided with means for carrying a current between them, and in that the first connection is provided with means for deriving a potential from it.

The potential barrier created by the barrier zone prevents charge carriers from moving freely to and from between the two sub-regions. The chance that a charge carrier can pass the carrier zone and enter the other sub-region, called transmission probability for short hereinafter, depends strongly on the energy of the charge carrier and is on average equally large for the charge carriers in the first sub-region and for the charge carriers in the second sub-region. If, however, a current is sent through the second sub-region by means of the second and third connections during operation, the charge carrier gas is heated there. Owing to the temperature rise, the probability of a charge carrier having an energy sufficiently large for passing the carrier zone rises exponentially in the second sub-region. The temperature of the charge carrier gas in the first sub-region has not or substantially not risen, so the average transmission probability has remained at its original level. As a consequence, on the average more charge carriers will move from the second sub-region to the first than vice versa. Once they have entered the first sub-region, the impulse direction of the charge carriers penetrated thus far prevents them returning to the second region without having interacted with the lattice. Owing to this interaction, the penetrated charge carriers lose much of their energy, so that the chance of them passing the barrier once more is considerably reduced. Statistically this implies that the transmission through the barrier zone is in fact irreversible and that the charge carriers which have penetrated into the first sub-region are locked up there. As a result, the potential of that region relative to any given reference potential changes until a stationary state has been reached. The eventual potential change can be taken off at the first connection and is found that to be dependent on the square of the current value through the second and the third connections within very narrow limits.

An external voltage may be taken by way of reference voltage, but it is also possible, for example, to use the potential of the second sub-region for this purpose It is then preferable to provide the second region with a fourth connection. In that case the potential change between the first and the fourth connection can be derived without flow of current, so that the influence of a contact resistance can be eliminated.

To further reduce the probability of returning to the second sub-region of charge carriers once they have penetrated through the barrier zone, a particular embodiment of the element according to the invention is characterized in that the insulation zone on either side of the barrier zone has a shape which fans out in the direction of the first sub-region. In the case of such a shape, the chance that hot charge carriers are scattered back to the second sub-region within the barrier zone is rather small.

The efficiency of the element becomes larger as more of the excited charge carriers actually arrive in the first sub-region. A further embodiment of the element according to the invention, therefore, is characterized in that at least the second and the third connection are provided at a distance from the barrier zone which is smaller than the average free path length. The excited charge carriers will then arrive at the barrier zone without collisions in which the additional energy is partly lost, so that their energy, and thus their transmission probability, is still at a maximum.

Moreover, the efficiency can he improved in that the second sub-region is provided with a mirroring boundary at the side of the insulation zone remote from the second and third connections with this boundary it can be achieved that excited charge carriers with an impulse direction away from the barrier zone are reflected back towards the carrier zone, so that they can penetrate the barrier zone in the second instance. Preferably, the boundary is so designed that the charge carriers have an at least substantially elastic interaction with it, so that substantially no energy is lost upon the reflection and hence the transmission probability is not reduced. Such a boundary may be formed by, for example, a groove, but the charge carriers also have a substantially elastic interaction with a depletion region so that the boundary may likewise be formed by a depletion region.

BRIEF DESCRIPTION OF THE DRAWING

The invention will now be explained in greater detail with reference to several embodiments and an accompanying drawing. In the drawing.

The Figures are purely diagrammatic and not drawn to scale. In particular, some dimensions are exaggerated for the sake of clarity. Corresponding parts are generally indicated with the same reference numerals.

DESCRIPTION OF THE PREFERRED EMBODIMENTS

Figure 1:
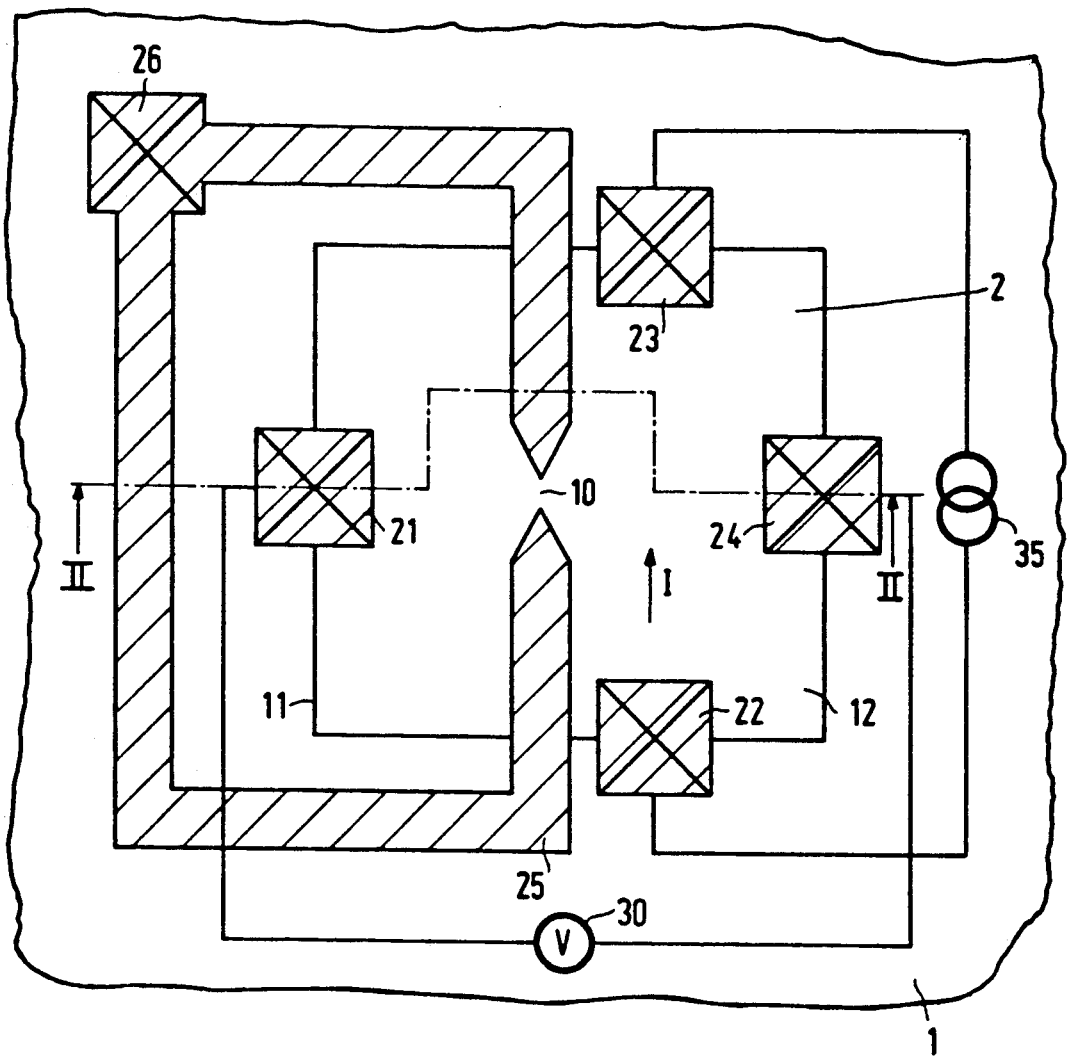
FIG. 1 shows a plan view of a first embodiment of the element according to the invention.

In a first embodiment, the element comprises a semi-insulating substrate 1 of gallium arsenide (GaAs) on which a layer structure in the shape of a mesa 2 is provided, see FIG. 1. As is shown in cross-section in FIG. 2, the mesa 2 comprises a lower layer 3 of undoped GaAs on which an approximately 60 nm thick layer 5 of silicon-doped aluminum gallium arsenide (AlGaAs) is provided. The doped AlGaAs layer 5 is separated from the lower layer 3 by a relatively thin, undoped AlGaAs layer 4.

Figure 2:
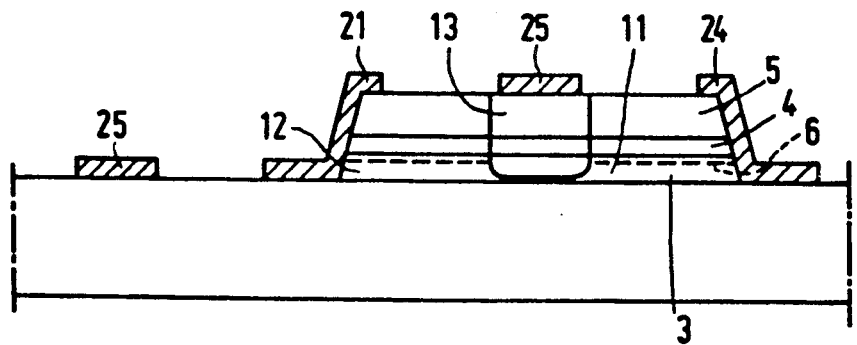
FIG. 2 shows a cross-section taken on the line II—II in FIG. 1.

AlGaAs has a greater energy gap than GaAs, which leads to a potential minimum in the GaAs layer 3 near a boundary surface with the AlGaAs layer 4 Free electrons originating from the donor Si atoms from the AlGaAs layer 5 collect in the potential minimum and form a substantially two-dimensional electron gas there, which is diagrammatically indicated with broken line 6 in FIG. 2. Since the electrons are separated from the donor atoms, they have a strongly increased mobility in the gas and a comparatively great mean free path of approximately 10 μm. This is additionally enhanced by the presence of the undoped intermediate layer 4 which screens off the influence of the Si atoms on the mobility of the electrons in the gas 6.

Figure 3:
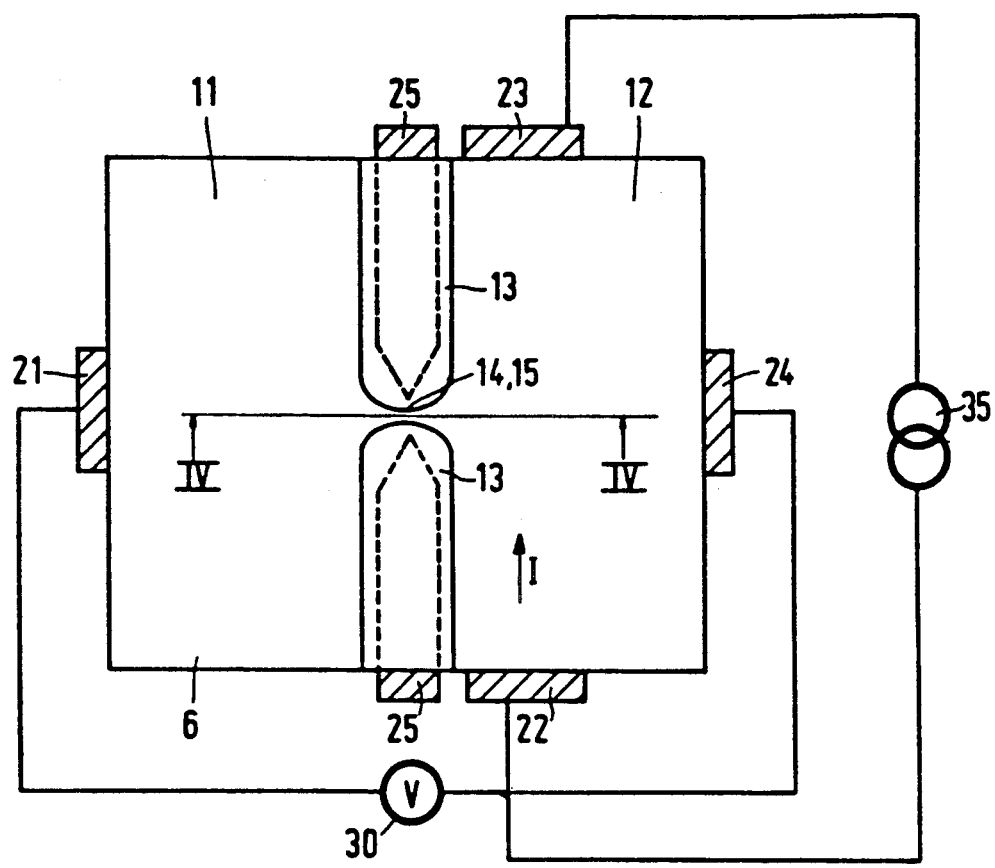
FIG. 3 shows a section taken on the line III—III in FIG. 2 at the level of the electron gas.

A gate electrode 25 of gold, which forms a Schottky transition with the subjacent AlGaAs 5, is provided on the mesa. The gate electrode 25 is connected to a negative voltage via the gate connection 26 during operation, so that free charge carriers are dispelled from below the gate electrode. The result is a depletion zone 13 which extends to beyond the electron gas 6 and forms an insulation zone which divides the electron gas 6 into a first sub-region 11 and a second sub-region 12. A cross-section through the mesa 2 at the level of the electron gas 6 is shown in FIG. 3, in which the depletion zone 13 is indicated diagrammatically. The gate electrode 25 is provided with an opening 10 between the two sub-regions 11, 12, so that at the level of the electron gas and between the two sub-regions 11, 12 the insulation zone 13 is interrupted by a channel 14, whose width may be varied on variation of the potential at the gate electrode 25.

Figure 4:
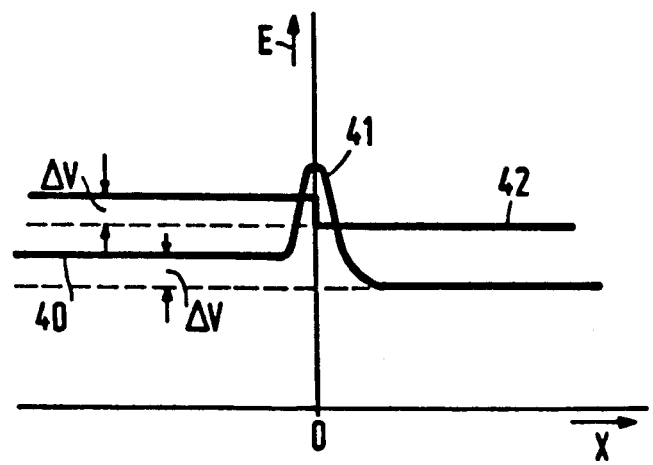
FIG. 4 diagrammatically shows the potential of the bottom of the conduction band taken on the line IV—IV of FIG. 3.

During operation the element is cooled down to approximately 1,5K, at which temperature the electron gas 6 is fully degenerated. The width of the channel 14 is set for a value in the order of the wavelength of the electrons at the Fermi level, which is 42 nm in the present case. In that case, the curve 40 in FIG. 4 represents the potential of the bottom of the conduction and running along an imaginary line IV—Iv through the channel 14. The origin 0 for the curve is then located in the channel 14. The channel 14 forms a carrier zone 15 with potential barrier 41, which prevents a free passage of electrons from the one sub-region 11 to the other one 12 and vice versa.

The element is provided with four connections 21-24. A first and a fourth connection 21, 24 are provided on either side of the channel at the first 11 and the second sub-region 12, respectively, and connected to means 30 for deriving the potential of the first sub-region 11. When the element is used in an electric circuit, the means 30 may comprise any load as desired. In the present example, however, the means 30 are formed by a potentiometer for determining an output signal of the element. The second sub-region 12 is further provided with a second connection 22 and a third connection 23, which are connected to a current source 35.

When the element is not operating, the temperature of the electron gas on either side of the barrier zone 15 is practically equal to the temperature of the lattice, $T_0$. The chance $f(E)$ that an electron has an energy E greater than the potential barrier 41 is given by the Fermi-Dirac distribution in the present case, in which the electron gas 6 is practically fully degenerated.

$$f(E) = [1 + e^{E-E_f)/k\cdot T_0}]^{-1}$$

Where $E_f$ is the energy of the Fermi level and k Boltzman's constant. The distribution is the same in both sub-regions 11, 12, so that on average an equal number of electrons move from the first sub-region 11 to the second sub-region 12 and the other way around. If, however, a current I is sent through the second sub-region 12 by means of the two current-passing connections 22, 23, the electron gas 6 in the second sub-region 12 will be heated up and assume a higher temperature $T_1$. The Fermi-Dirac distribution in the second sub-region 12 then has the following form by fair approximation.

$$f_2(E) = [1 + e^{E-E_f)/k\cdot T_1}]^{-1}$$

It is clear from the above that the temperature rise of the electron gas 6 in the second sub-region 12 leads to an exponential increase of the chance that an electron has an energy larger than the potential barrier 41 of the barrier zone 15. In the first sub-region 11, however, the temperature of the electron gas 6 is still equal to the latice temperature $T_0$, so that on average more electrons will move from the second sub-region 12 to the first sub-region than in the other direction now.

Once it is in the first sub-region 11, an electron is prevented by its impulse direction from passing the barrier zone 15 once more without preceding interaction with the lattice. This interaction relaxes the energy of the electron towards the energy of the lattice, so that a second passage through the barrier zone 15 is practically excluded. The passage of the barrier zone 15 is thus irreversible. The electron is enclosed in the first sub-region 11 and causes a negative potential there relative to the potential of the second sub-region 12. The resulting increase in the potential energy is indicated diagrammatically in FIG. 4 with the line 42. The difference between the energy level of the first sub-region 11 and that of the second sub-region 12 corresponds to a potential difference $\Delta V$. For a given potential difference $\Delta V$ between the two sub-regions 11, 12, the Fermi-Dirac distribution in the first sub-region 11 then has the following form:

$$f_1(E) = [1 + e^{E-E_f-e\Delta V)/k\cdot T}]^{-1}$$

in which e indicates the elementary charge. On average, more electrons continue passing from the second sub-region 12 to the first sub-region 11 until the potential difference $\Delta v$ is so high that a stationary state is reached.

In that case the electron flows from the two sub-regions 11, 12 through the barrier zone are the same, so that we can write $$\int_0^\infty T(E) \cdot f_1(E) dE = \int_0^\infty T(E) \cdot f_2(E) dE$$

in which T(E) represents the transmission chance. In general, this equation can be solved numerically only for $\Delta V$. A maximum potential difference is obtained by means of a barrier height which rises approximately $kT_0$ above the Fermi level. The following will then hold by approximation:

$$\Delta v \approx k(T_1 - T_0)/e$$

Figure 5:
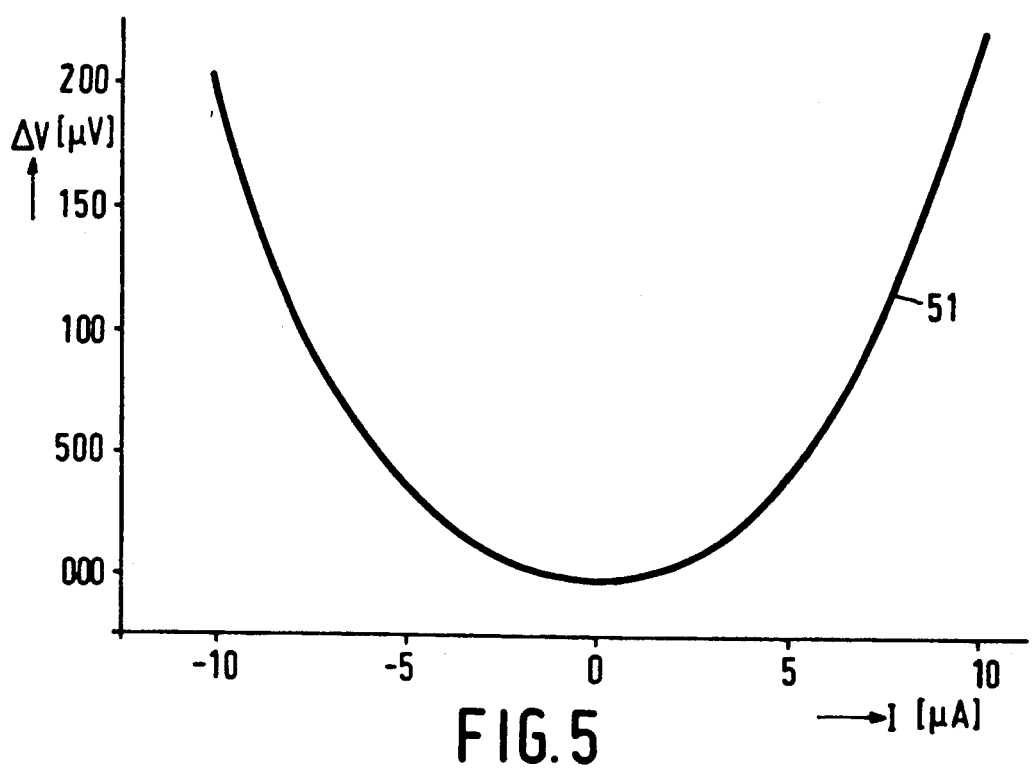
FIG. 5 diagrammatically shows the output voltage of the element as a function of the input current.

The output voltage is then proportional to the temperature difference caused by the current I, which difference will be substantially proportional to the power dissipated in the second sub-region 12 and thus to the square of the current I. The eventual potential difference $\Delta V$ may be derived between the first and fourth connections 21, 24. The curve 51 in FIG. 5 gives the potential difference $\Delta V$ measured with the potentiometer 30 as a function of the current strength I. The potential difference $\Delta V$ is indeed found to be proportional to the square of the current I within very narrow limits.

Such an output characteristic renders the element according to the invention particularly suitable for generating, for example, a second harmonic of a signal. In that case the signal is supplied to the second and third connections 22, 23 in the shape of a current I and the second harmonic of the signal may be derived at the first connection 21. Furthermore, the element may be used for parametric amplification of a signal, in which both a alternating bias current $I_1 \sin w_1 t$ with a frequency $w_1$ and an alternating current $I_2 \sin w_2 t$ with a frequency $w_2$ can be passed through the second sub-region 12 via the current conducting connections 22, 23. The potential which can then be derived at the first connection 21 comprises a component with the differential frequency $|w_1 - w_2|$, the quantitative value of which is proportional to $I_1 - I_2$.

The time in which the first sub-region 11 assumes a modified potential as a result of a temperature rise in the second sub-region 12 is approximately equal to the time required for an electron to pass the carrier zone, which is in the order of one picosecond. As a result, the element is particularly suitable for processing of alternating signals having a very high frequency such as, for example, in the field of satellite communication, where signals with a frequency of a few tens of GHz are used.

Figure 6:
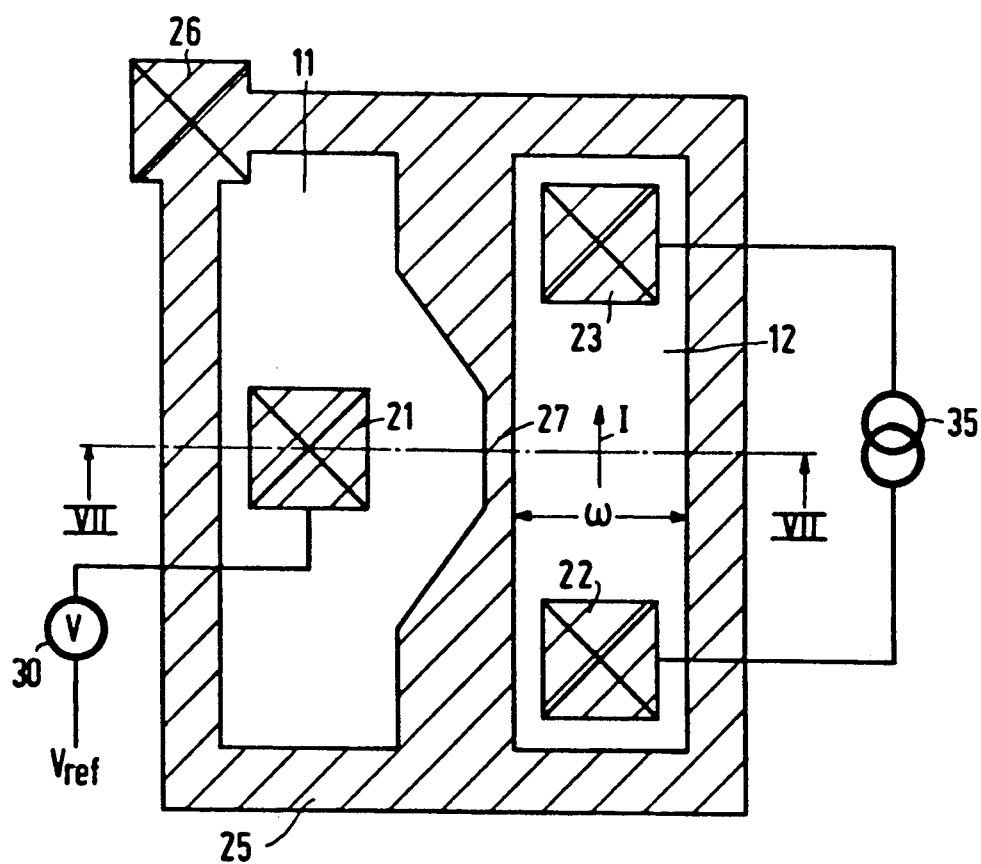
FIG. 6 shows a plan view of a second embodiment of the element according to the invention.
Figure 7:
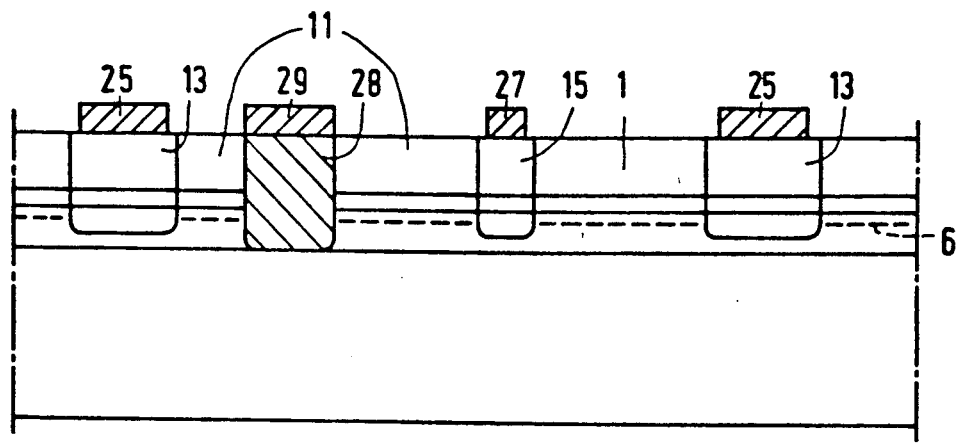
FIG. 7 shows a cross-section taken on the line VII—VII in FIG. 6.

FIG. 6 shows a second embodiment of the element according to the invention. As is shown in cross-section in FIG. 7, the element comprises a substrate 1 on which are provided in that order an undoped GaAs layer 3, a thin undoped AlGaAs layer 4 and a silicon-doped AlGaAs layer 5. Near the interface between the GaAs layer 3 and the AlGaAs layer 4 there is a potential minimum in which free electrons originating from the Si atoms collect in order to form a practically two-dimensional charge carrier gas 6 The element is cooled down to a temperature below 100K during operation, the electron gas 6 being at least substantially completely degenerated then.

In contrast to the preceding embodiment, the electron gas 6 in the present case is not delimited in a mesa, but a gate electrode 25 with a closed shape and provided on the surface of the layer structure 3, 4, 5 bounds the electron gas. During operation, a depletion zone 13 is formed below the gate electrode 25, which zone completely surrounds part of the electron gas 6. The gate electrode 25 moreover divides the enclosed portion of the electron gas 6 over a first sub-region 11 and a second sub-region 12. The gate electrode 25 is locally provided with a narrowed portion 27 between the two sub-regions 11, 12, so that a barrier zone 15 is formed there in the subjacent depletion zone, the potential barrier of said barrier zone being lower than that of the adjoining portion of the depletion zone 13.

A first connection 21 is provided at the area of the first sub-region 11 in the shape of an n-type zone 28 which extends from the surface to the electron gas 6 and which is provided at the surface with a metal layer 29. The potential of the first sub-region 11 relative to any reference potential $V_{ref}$ may be derived at the first connection 21. At the second sub-region 12, similar zones are provided for forming a second and a third connection 22, 23, which are connected to a current source 35.

During operation, a current I is passed through the second sub-region 12 by means of the second and third connections 22, 23. This causes the temperature of the electron gas 6 in the second sub-region 12 to rise. Electrons having a sufficiently high energy, so-called hot electrons, are capable of penetrating through the barrier zone 15 and entering the first sub-region 11. This changes the potential of the first sub-region 11 relative to the reference voltage $V_{ref}$, which potential can be derived at the first connection 21. This voltage is proportional to at least substantially the square of the current I passed through the second sub-region 12.

An external voltage may be taken by way of reference potential, but it is alternatively possible to use the potential of the second sub-region 12 as a reference. This potential may then be derived at the second or third connection 22, 23. In that case, however, a linear term is added to the output potential as a result of the contact resistance of the second or third connection since, unlike in the first embodiment, in this case the reference voltage is derived from a current-passing connection.

In this embodiment the gate electrode 25, and thus the subjacent depletion zone 13, has a shape which fans out in the direction of the first sub-region 11, so that hot electrons once arrived in the barrier zone 15 have only a small chance of returning to the second sub-region 12. The hot electrons are thus better closed in in the first sub-region 11, which increases the efficiency of the element.

The efficiency can be further increased by ensuring that as many as possible of the generated hot electrons actually pass the barrier zone 15 before they have lost part of their energy. The width w of the second sub-region 12 in the present example, therefore, is no more than a few μm, which is less than the average free path length of the electrons, which is 10 μm in this case. Electrons having a direction of movement away from the carrier zone 15 are then reflected back in the direction of the barrier zone 15 by the surrounding depletion zone 13 in many cases before they have collided with other electrons. Since the interaction with the depletion zone 13 is at least substantially elastic, the electrons lose substantially no energy. The same holds true if the boundary of the second sub-region 12 should be formed by a groove, as is the case in the first embodiment.

The transmission probability of the generated hot electrons is improved even further when the hot electrons are generated in very close proximity to the barrier zone 15. This is achieved in the present embodiment in that the second and third connections 22, 23 are both provided at a distance of a few μm from the barrier zone 15. Thus it is counteracted that the hot electrons collide with other electrons before arriving at the barrier zone 15, so that their transmission probability at that moment is still at a maximum.

Figure 8:
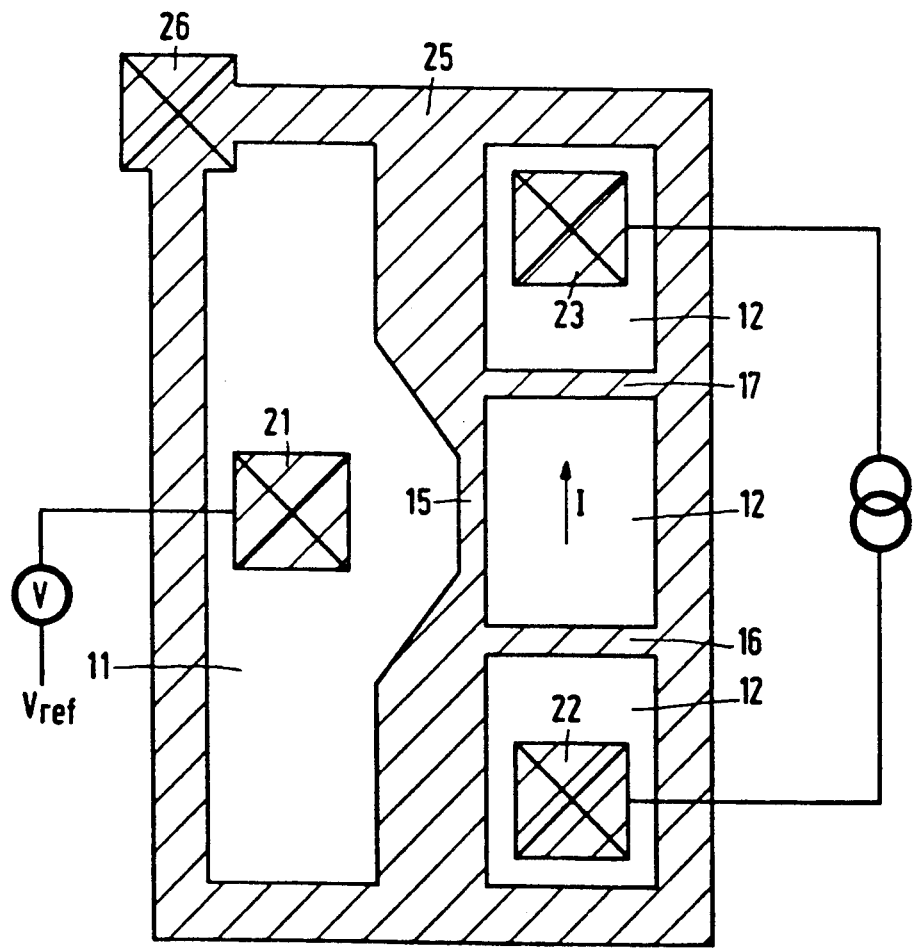
FIG. 8 shows a plan view of a third embodiment of the element according to the invention.

The efficiency can also be increased in that an additional potential barrier is provided in the current path of the current I passed through the second sub-region 12 in the proximity of the carrier zone 15, as is the case in a third embodiment of the element according to the invention, see FIG. 8. The third embodiment is based on the element of FIG. 6. In this case, however, a second and a third barrier zone 16, 17 are provided between the narrowed portion 27 in the gate electrode 25 and each of the current-passing connections 22, 23, respectively. The second and third carrier zones are formed by portions of the gate electrode 25 which extend between the two side walls of the second sub-region 12 and are narrower than the adjoining portions of the gate electrode 25. Owing to such a configuration, the current I running between the two connections contains substantially exclusively electrons having an energy greater than that of the potential barriers created by the two further barrier zones 16, 17 in the current path. The electrons which arrive at the first barrier zone 15 thus all have substantially a strongly increased transmission probability, so that the share in the current I accounted for by the electrons actually arriving in the first sub-region 11, and thus the efficiency of the element, will be comparatively great/high.

Although the invention has been explained in more detail with reference to only a few embodiments, it will be obvious that the invention is not restricted to the examples given. Many variations are possible for those skilled in the art within the scope of the invention.

Thus the insulation region and the barrier region may also be formed by, for example, pn insulation, a dielectric region, or a semiconductor hetero structure.

Furthermore, the examples given are all based on a degenerated two-dimensional electron gas. The invention also applies, however, if the charge carrier gas is not degenerated, extends over more or fewer dimensions, or consists of holes.

Moreover, the element need not be manufactured in a body of III-V material, as in the examples given, but a different semiconductor material may also be used, such as, for example, silicon or germanium or a II-VI semiconductor. In addition, the element according to the invention may in principle also be manufactured in a metal, the insulation region and the barrier zone being formed by, for example, dielectric layers.

We claim:

1. A element for use in an electric circuit, comprising a body having a region in which a charge carrier gas is formed at least during operation, which region comprises a first and a second sub-region which are separated from one another by an insulation zone which is insulating at least during operation, the first sub-region being provided with a first electrical connection and the second sub-region comprising a second and a third electrical connection, characterized in that the insulating zone between the two sub-regions is locally interrupted by a barrier zone which forms a potential barrier for the charge carriers whose level is lower than that of the adjoining insulation zone, in that the second and third connections are provided with means for carrying a current between them, and in that the first connection is provided with means for deriving a potential from it.

2. An element as claimed in claim 1, characterized in that the second region is provided with a fourth connection which is connected to the means for deriving the potential from the first connection.

3. An element as claimed in claim 1 or 2, characterized in that the insulation zone on either side of the barrier zone has a shape which fans out in the direction of the first sub-region.

4. An element as claimed in claim 1 or 2, characterized in that at least the second and the third connection are provided at a distance from the barrier zone which is smaller than the mean free path of the charge carriers.

5. An element as claimed in claim 1 or 2, characterized in that the second sub-region is narrower than the mean free path of the charge carriers in a direction transverse to the current direction.

6. An element as claimed in claim 1 or 2, characterized in that a further barrier zone is provided between the barrier zone and at least one of the said second and third connections.

* * * * *